United States Patent
Chen

(10) Patent No.: US 10,700,239 B1
(45) Date of Patent: Jun. 30, 2020

(54) MICRO LIGHT-EMITTING DIODE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia, AS (US)

( * ) Notice: Subject to any disclaimer, the term of this patent is extended or adjusted under 35 U.S.C. 154(b) by 0 days.

(21) Appl. No.: 16/360,035

(22) Filed: Mar. 21, 2019

(51) Int. Cl.
*H01L 33/26* (2010.01)
*H01L 33/02* (2010.01)
*H01L 33/14* (2010.01)
*H01L 33/36* (2010.01)

(52) U.S. Cl.
CPC ............ *H01L 33/26* (2013.01); *H01L 33/025* (2013.01); *H01L 33/14* (2013.01); *H01L 33/145* (2013.01); *H01L 33/36* (2013.01)

(58) Field of Classification Search
CPC ..... H01L 33/025; H01L 33/14; H01L 33/145; H01L 33/26
USPC ................................................ 257/101–103
See application file for complete search history.

(56) References Cited

U.S. PATENT DOCUMENTS

| | | | | |
|---|---|---|---|---|
| 6,200,827 | B1* | 3/2001 | Kimura | H01L 33/007 257/E33.067 |
| 10,340,421 | B1* | 7/2019 | Chen | H01L 21/02647 |
| 2010/0065861 | A1* | 3/2010 | Nagai | H01L 33/50 257/88 |
| 2018/0019302 | A1* | 1/2018 | Deppe | H01L 29/8083 |
| 2019/0148593 | A1* | 5/2019 | Islam | H01L 33/32 257/13 |
| 2019/0378452 | A1* | 12/2019 | Lin | G09G 3/2003 |

* cited by examiner

*Primary Examiner* — Matthew E Warren
(74) *Attorney, Agent, or Firm* — CKC & Partners Co., LLC

(57) ABSTRACT

A micro light-emitting diode is provided. The micro light-emitting diode includes a first type semiconductor layer and a second type semiconductor layer. The first type semiconductor layer includes at least one low resistance portion and a diffuse type high resistance portion. The low resistance portion extends between and reaches a first surface and a second surface of the first type semiconductor layer. The diffuse type high resistance portion extends between and reaches the first surface and the second surface. A thickness of the first type semiconductor layer is less than half of a lateral length of the low resistance portion on the first surface. The low resistance portion and the diffuse type high resistance portion form an interface therebetween on the first surface. A concentration of a guest material starts decreasing from the interface toward the low resistance portion.

10 Claims, 9 Drawing Sheets ns to a micro light-emitting
MICRO LIGHT-EMITTING DIODE

BACKGROUND

Field of Invention

The present disclosure relates to a micro light-emitting diode having a current confinement structure.

Description of Related Art

The statements in this section merely provide background information related to the present disclosure and do not necessarily constitute prior art.

In recent years, light-emitting diodes (LEDs) have become popular in general and commercial lighting applications. In some applications such as displays which are used under a variety of environmental conditions, a wider dynamic range of an LED brightness output becomes important.

A conventional LED is sometimes operated in a nonlinear region of a current density-to-voltage (J-V) relation since the current density is too low. Besides, variations of forward voltages in different LEDs are not within an acceptable range even though manufacturing processes variations for those LEDs are within tolerable ranges. Therefore it is not easy to control a brightness uniformity of the LEDs.

SUMMARY

According to some embodiments of the present disclosure, a micro light-emitting diode is provided. The micro light-emitting diode includes a first type semiconductor layer and a second type semiconductor layer. The first type semiconductor layer has a first surface, a second surface opposite to the first surface, and a side surface connecting and extending between and in contact with the first surface and the second surface. The first type semiconductor layer includes at least one low resistance portion and a diffuse type high resistance portion. The low resistance portion extends between and reaches the first surface and the second surface. The diffuse type high resistance portion extends between and reaches the first surface and the second surface. A guest material in the diffuse type high resistance portion has a constant concentration on the first surface and a concentration of the guest material in the first type semiconductor layer decreases from the diffuse type high resistance portion toward the low resistance portion. A thickness of the first type semiconductor layer is less than half of a lateral length of the low resistance portion on the first surface. The low resistance portion and the diffuse type high resistance portion form an interface therebetween on the first surface, and a concentration of the guest material starts decreasing from the interface toward the low resistance portion. The second type semiconductor layer is joined with the first type semiconductor layer through the second surface.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
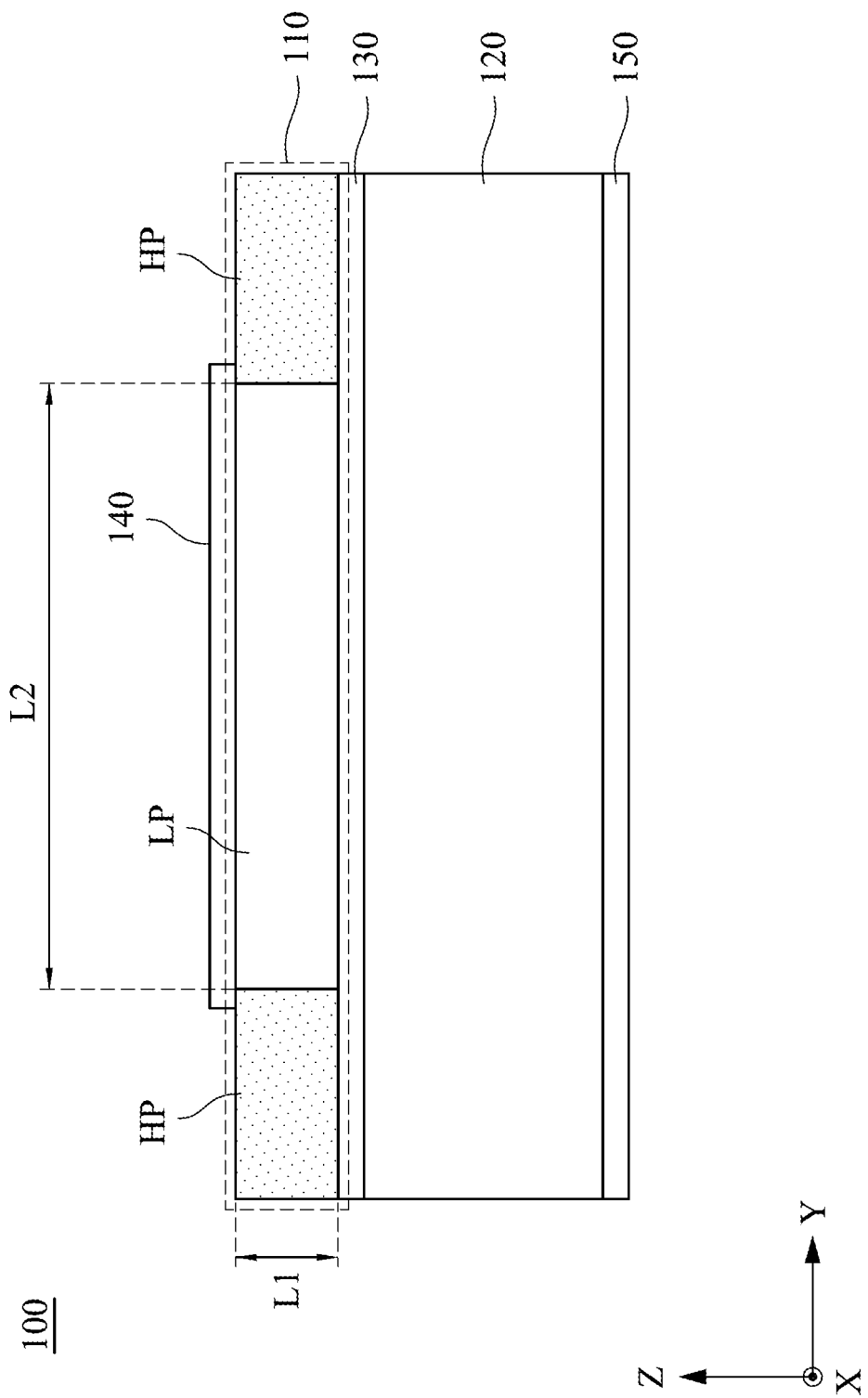
FIG. 1A is a schematic cross-sectional view of a micro light-emitting diode according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1B:
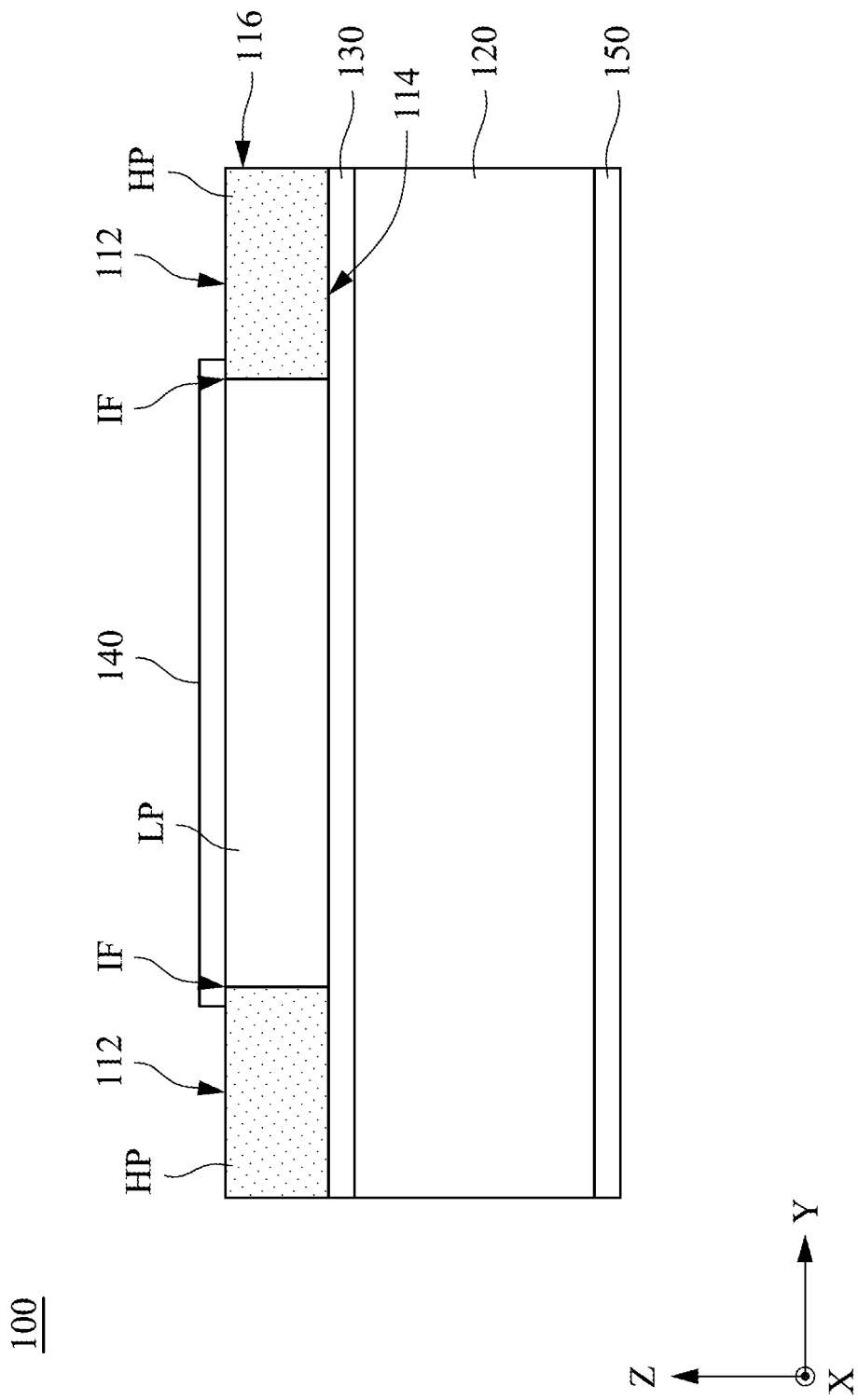
FIG. 1B is a schematic cross-sectional view of a micro light-emitting diode according to some embodiments of the present disclosure.
Figure 1C:
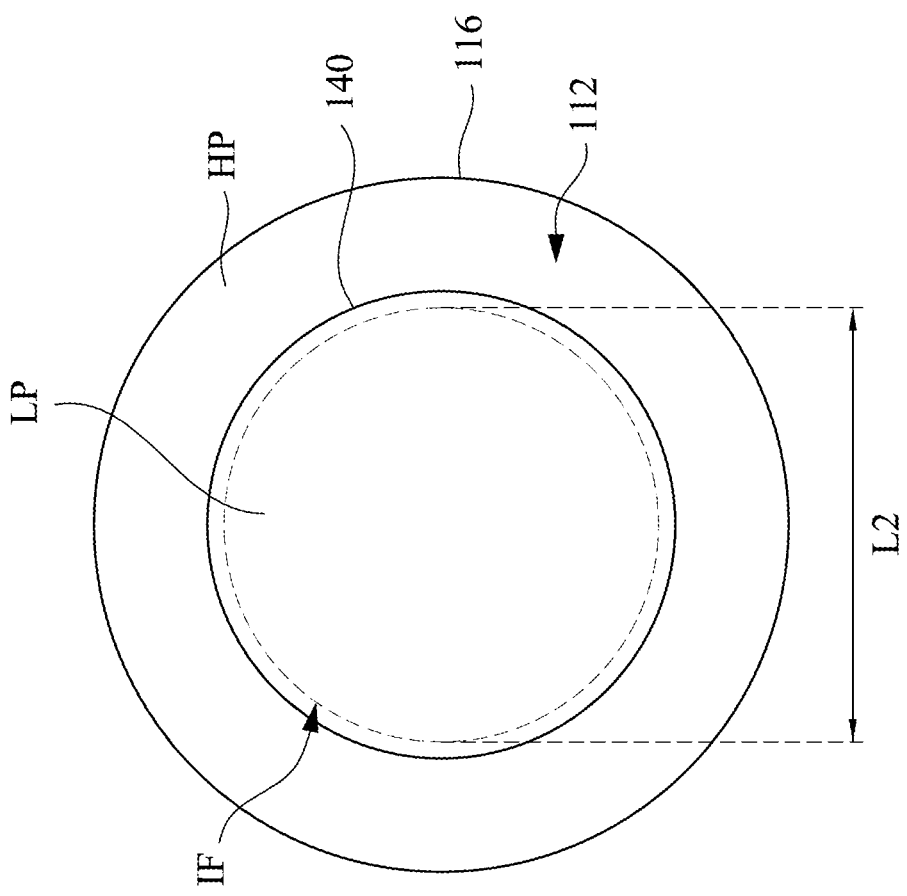
FIG. 1C is a schematic top view of a micro light-emitting diode according to some embodiments of the present disclosure.

Reference is made to FIGS. 1A to 1C. FIGS. 1A and 1B are schematic cross-sectional views of a micro light-emitting diode 100. FIG. 1C is a schematic top view of the micro light-emitting diode 100. FIGS. 1A and 1B are the same figure with different labels indicated so as to make the layout less crowded. In some embodiments, the micro light-emitting diode 100 includes a first type semiconductor layer 110 and a second type semiconductor layer 120. In some embodiments, the first type semiconductor layer 110 is a p-type semiconductor layer, and the second type semiconductor layer 120 is an n-type semiconductor layer, but should not be limited thereto. The first type semiconductor layer 110 has a first surface 112, a second surface 114 opposite to the first surface 112, and a side surface 116 connecting and extending between and in contact with the first surface 112 and the second surface 114. The second type semiconductor layer 120 is joined with the first type semiconductor layer 110 through the second surface 114. In some embodiments, an active layer 130 is between the first type semiconductor layer 110 and the second type semiconductor layer 120. Opposite sides of the active layer 130 are respectively joined with the first type semiconductor layer 110 and the second type semiconductor layer 120. The active layer 130 is in contact with the second surface 114. A direction Z shown in figures is a thickness direction, which is perpendicular to a lateral direction of the micro light-emitting diode 100 lying on an X-Y plane. The X-Y plane is expanded by a direction X and a direction Y perpendicular to the direction X. In some embodiments, a lateral length of the micro light-emitting diode 100 is less than or equal to about 100 μm.

The first type semiconductor layer 110 includes at least one low resistance portion LP and a diffuse type high resistance portion HP. The low resistance portion LP extends between the first surface 112 and the second surface 114. The low resistance portion LP also reaches the first surface 112 and the second surface 114. The diffuse type high resistance portion HP extends between the first surface 112 and the second surface 114. The diffuse type high resistance portion HP also reaches the first surface 112 and the second surface 114. A guest material in the diffuse type high resistance portion HP has a constant concentration on the first surface 112, and a concentration of the guest material in the first type semiconductor layer 110 decreases from the diffuse type high resistance portion HP toward the low resistance portion LP. The guest material can be titanium (Ti), silicon (Si), or chromium (Cr), which may come from a metal mask additionally on the diffuse type high resistance portion HP by diffusion (e.g., an isotropic diffusion) before the ultimate structure of the micro light-emitting diode 100 (as shown in FIGS. 1A to 1C) is formed. The metal mask will be described later. In some embodiments, the guest material in the diffuse type high resistance portion HP decreases from the first surface 112 to the second surface 114. A thickness L1 of the first type semiconductor layer 110 is less than half of a lateral length L2 of the low resistance portion LP on the first surface 112. The low resistance portion LP and the diffuse type high resistance portion HP form an interface IF therebetween on the first surface 112, and a concentration of the guest material starts decreasing from the interface IF toward the low resistance portion LP.

A combination of a substrate plus an epitaxial layer which forms the micro light-emitting diode 100 can be gallium phosphid (GaP) plus GaP, gallium arsenide (GaAs) plus gallium aluminum arsenide (GaAlAs), GaAlAs plus GaAlAs, GaAs plus gallium arsenide phosphide (GaAsP), gallium phosphide (GaP) plus GaAsP, GaAs plus indium gallium arsenide phosphide (InGaAlP), silicon carbide (SiC) plus SiC, zinc selenide (ZnSe) plus ZnSe, zinc sulfide (ZnS) plus ZnS, or gallium nitride (GaN) plus GaN, but should not be limited thereto. The relation that $L1<(\frac{1}{2})*L2$ is important in the current scenario since for materials mentioned above which help to form or constitute a part of the first type semiconductor layer 110, the guest material is formed by the isotropic diffusion.

In some embodiments, the micro light-emitting diode 100 further includes a first electrode 140 on the first surface 112 of the first type semiconductor layer 110. The first electrode 140 is in contact with the low resistance portion LP. In some embodiments, the first electrode 140 covers the entire low resistance portion LP from a view point as shown in FIG. 1C, such that a current flowing through the low resistance portion LP is substantially parallel to the direction Z, and the current density is determined by the lateral length L2 of the low resistance portion LP. In some embodiments, the micro light-emitting diode 100 further includes a second electrode 150 on the second type semiconductor layer 120. The second electrode 150 is in contact with the second type semiconductor layer 120.

As shown in FIGS. 1A to 1C, in some embodiments, the low resistance portion LP is isolated from the side surface 116 of the first type semiconductor layer 110 by the diffuse type high resistance portion HP. In some embodiments, the low resistance portion LP is enclosed by the diffuse type high resistance portion HP. With these conditions and the existence of a part of the low resistance portion LP which is not doped with the guest material due to the relation that $L1<(\frac{1}{2})*L2$, the current is confined to flow through the low resistance portion LP and has a higher current density plus an improved efficiency compared to situations without existences of divided low resistance portion LP and diffuse type high resistance portion HP. The higher current density is due to confinement of the current by the diffuse type high resistance portion HP. The efficiency is improved because a leakage current occurring at the side surface 116 is reduced. Said a leakage current may be caused by e.g., lattice defects. Besides, with the higher current density, an operation point of the micro light-emitting diode 100 is now within a linear region of current density-to-voltage relation (i.e., a J-V curve) of the micro light-emitting diode 100, which allows the current flowing through the micro light-emitting diode 100 to be more accurately controlled.

Figure 2A:
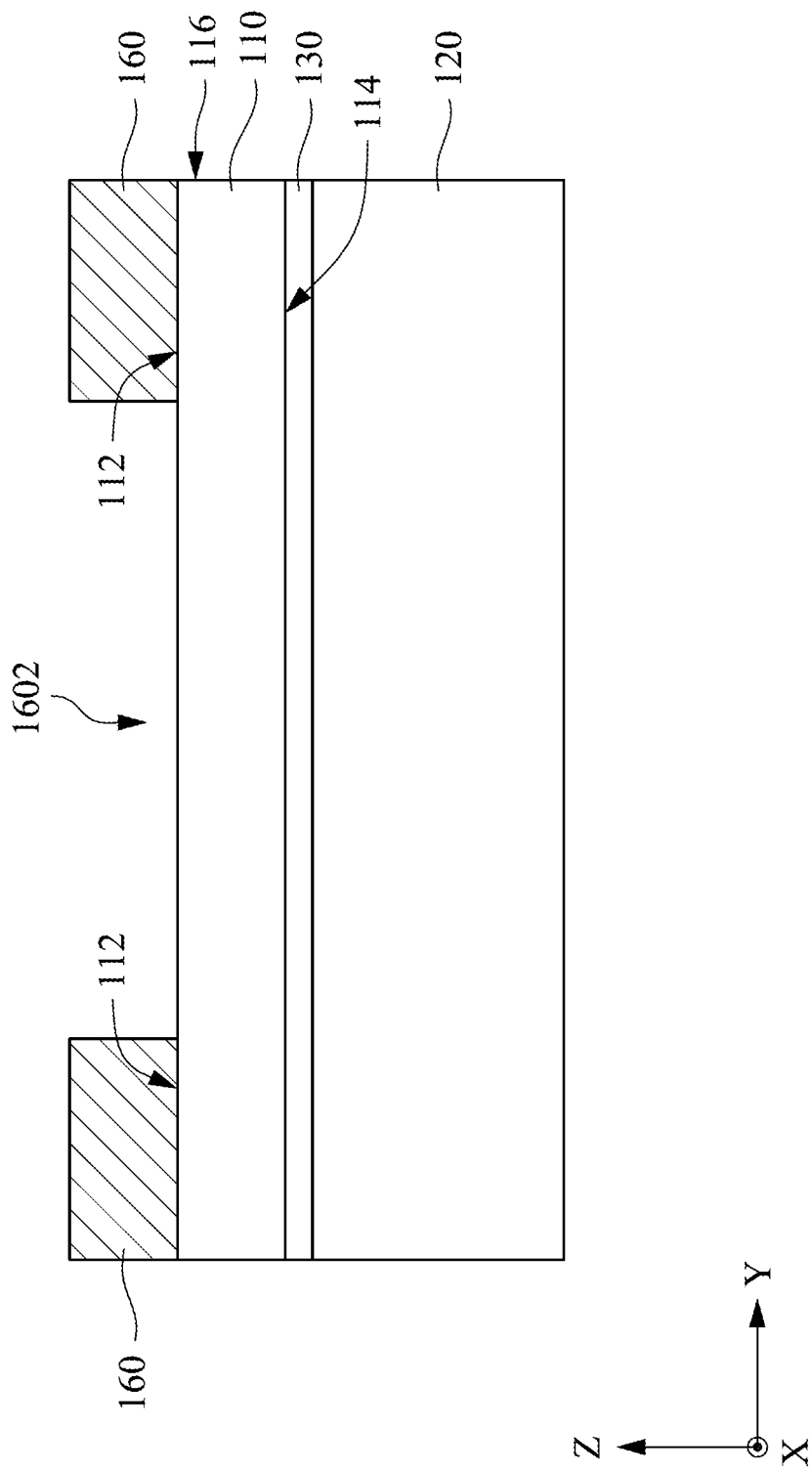
FIG. 2A is a schematic cross-sectional view of an intermediate stage of diffusing a guest material into a first type semiconductor layer of a micro light-emitting diode according to some embodiments of the present disclosure.
Figure 2B:
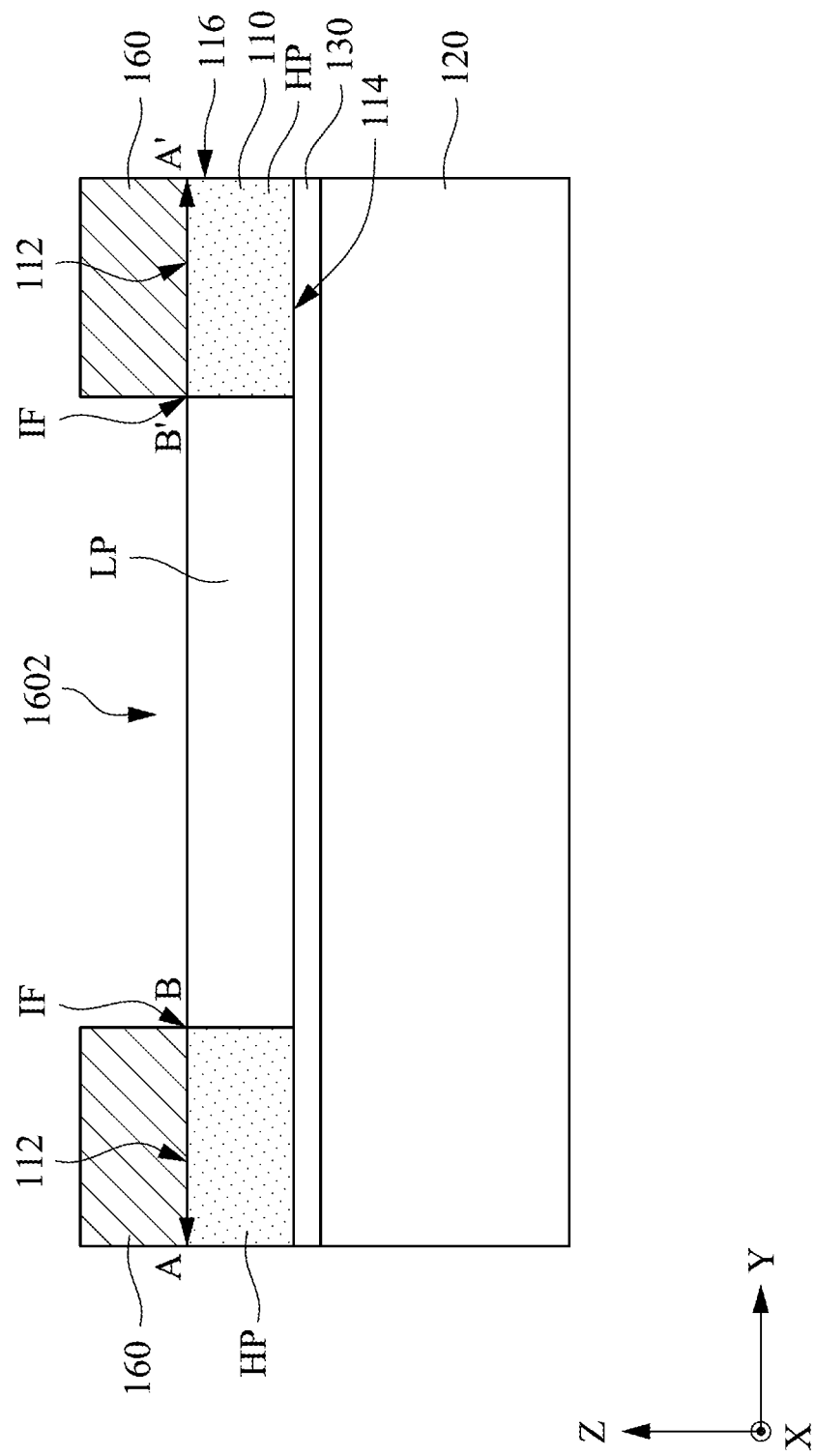
FIG. 2B is a schematic cross-sectional view of an intermediate stage of diffusing a guest material into a first type semiconductor layer of a micro light-emitting diode according to some embodiments of the present disclosure.

Reference is made to FIGS. 2A and 2B. FIG. 2A is a schematic cross-sectional view of an intermediate stage of diffusing the guest material into the first type semiconductor layer 110. FIG. 2B is a schematic cross-sectional view of an intermediate stage of diffusing the guest material into the first type semiconductor layer 110 subsequent to FIG. 2A. In some embodiments, the diffusion may be performed by letting the first surface 112 of the first type semiconductor layer 110 be in contact with a metal mask 160 (as referred to FIG. 2A). The metal mask may be made of Ti, Si, or Cr, but should not be limited thereto. A portion of the first type semiconductor layer 110 exposed by an opening 1602 of the metal mask 160 corresponds to the low resistance portion LP. A portion of the first type semiconductor layer 110 in contact with the metal mask 160 corresponds to the diffuse type high resistance portion HP. In some embodiments, a heating process is optionally performed. A temperature of said heating process can in a range from about 150 degree Celsius to about 800 degree Celcius. For example, when the metal mask 160 is made of Ti and the epitaxial layer is made of GaN, an interaction involving nitrogen vacancies may occur to form titanium nitride (TiNx) in the first type semiconductor layer 110. Therefore, the diffuse type high resistance portion HP and the low resistance portion LP are formed. A nitrogen vacancy density in the diffuse type high resistance portion HP is higher than a nitrogen vacancy density in the low resistance portion LP. Accordingly, the resistivity of the first type semiconductor layer 110 increases from the low resistance portions LP toward the diffuse type high resistance portion HP. In the above embodiments, the concentration of the guest material in the diffuse type high resistance portion HP decreases from the first surface 112 to the second surface 114. The metal mask 160 can be removed or kept without being removed after said diffusion, and the first electrodes 140 may be formed on the low resistance portion LP of the first type semiconductor layer 110. Besides using metal mask to introduce the guest material into the first type semiconductor layer 110, other methods such as a gas diffusion, a fluid diffusion, or an ion implementation can be alternative process to perform the diffusion, and will not be described in detail herein.

Figure 3A:
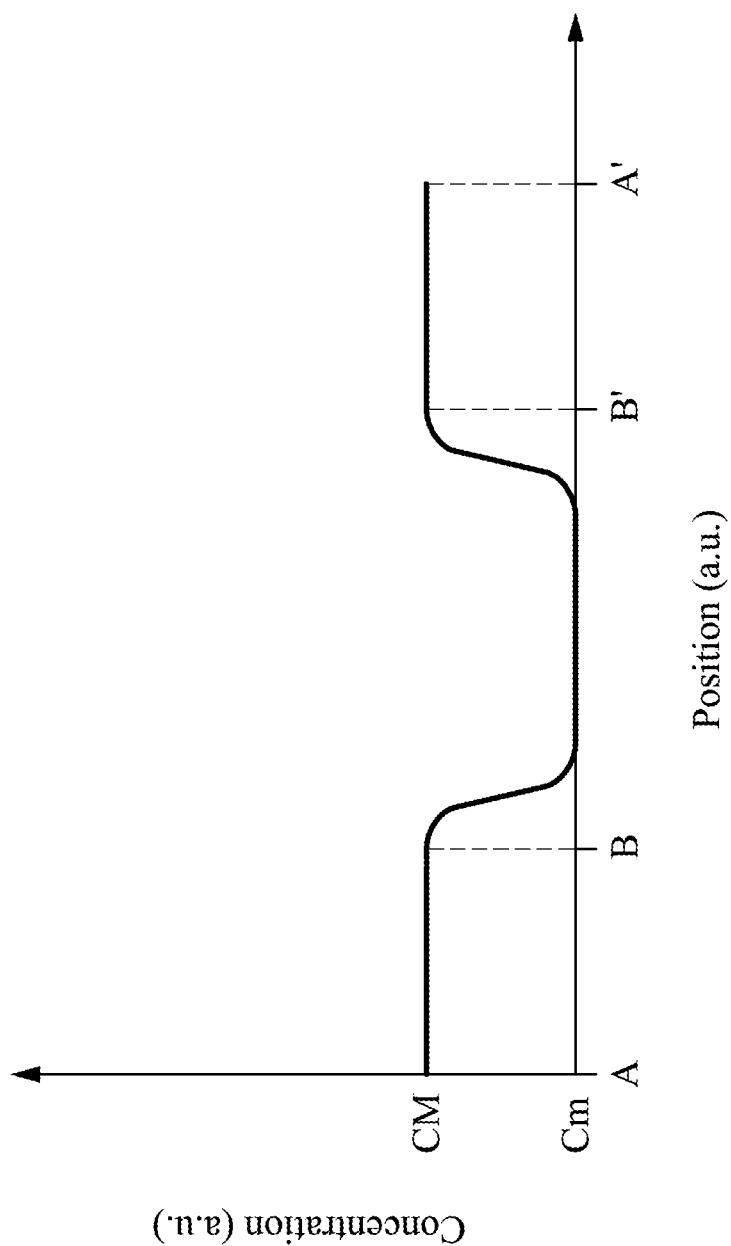
FIG. 3A is a schematic diagram illustrating a concentration distribution of a guest material along a line on a first surface of a first type semiconductor layer of a micro light-emitting diode according to some embodiments of the present disclosure.
Figure 3B:
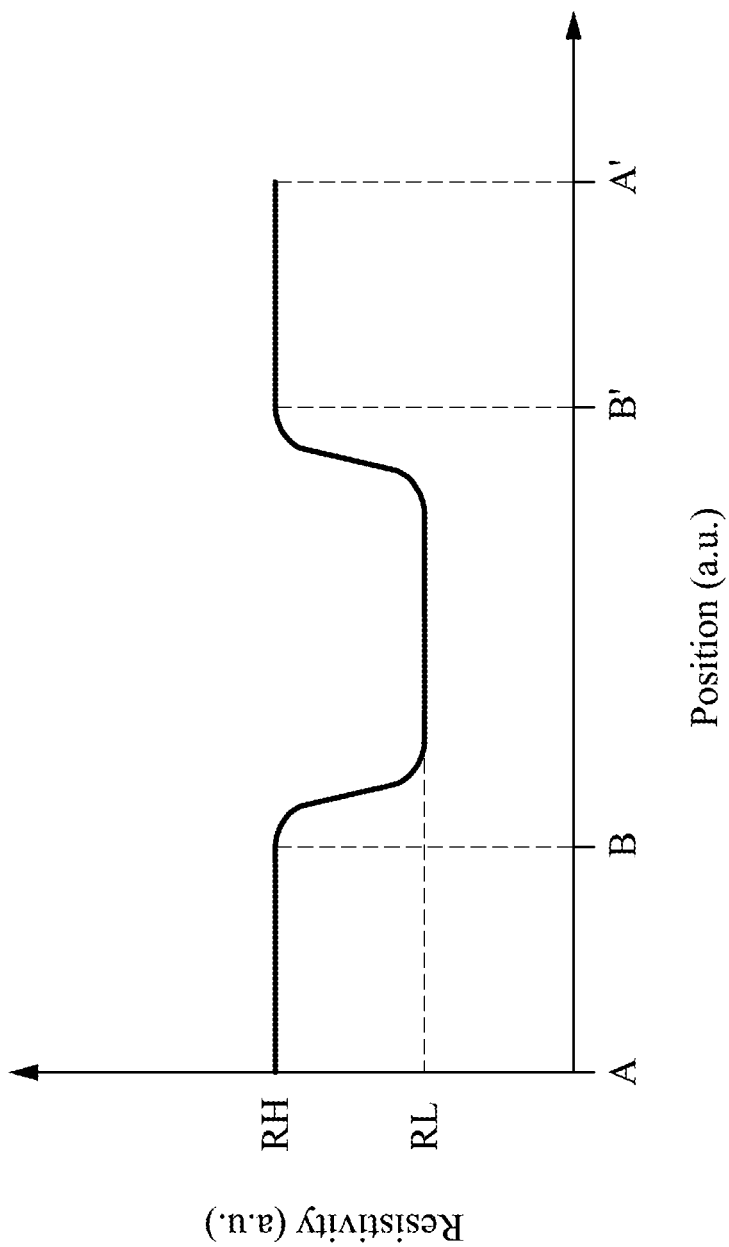
FIG. 3B is a schematic diagram illustrating a resistivity distribution along a line on a first surface of a first type semiconductor layer of a micro light-emitting diode according to some embodiments of the present disclosure.

Reference is made to FIGS. 3A and 3B. FIG. 3A is a schematic diagram illustrating a concentration distribution of the guest material along a line A-A' on the first surface 112 of the first type semiconductor layer 110 in FIG. 2B. FIG. 3B is a schematic diagram illustrating a resistivity distribution along the line A-A' on the first surface 112 of the first type semiconductor layer 110 in FIG. 2B. Generally, the resistivity of the first type semiconductor layer 110 is proportional to the concentration of the guest material. Therefore, after the diffusion as mentioned in the embodiments illustrated by FIGS. 2A and 2B, the resistivity of the first type semiconductor layer 110 is modified to increases from the low resistance portion LP toward the diffuse type high resistance portion HP. In some embodiments, one low resistance portion LP has at least one local minimum concentration Cm of the guest material therein, which can generally represent low resistivity RL, with very few exceptions, and those exceptions are beyond the scope of discussions in the present disclosure. In some embodiments, the low resistance portion LP has a maximum concentration CM of the guest material on the interface IF, which can generally represent high resistivity RH. With the condition that the thickness L1 of the first type semiconductor layer 110 is less than half of the lateral length L2 of the low resistance portion LP on the first surface 112, the minimum concentration Cm of the low resistance portion LP can exist, which is crucial for the current to flow through the low resistance portion LP so as to improve the efficiency. In some embodiments, a part of the low resistance portion LP with the minimum concentration Cm is the part that is not influenced by the guest material diffused from the diffuse type high resistance portion HP.

Figure 4A:
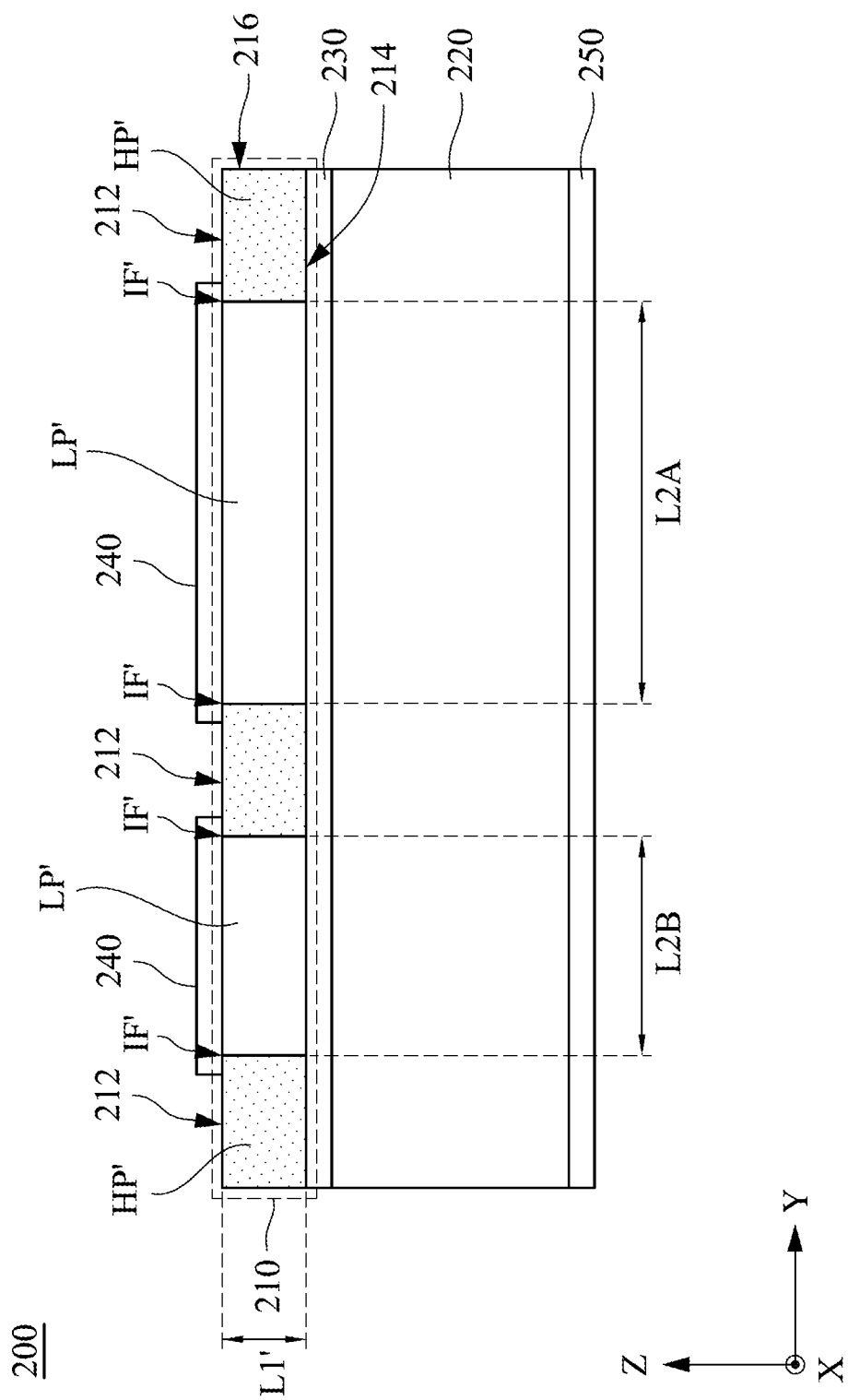
FIG. 4A is a schematic cross-sectional view of a micro light-emitting diode according to some embodiments of the present disclosure.
Figure 4B:
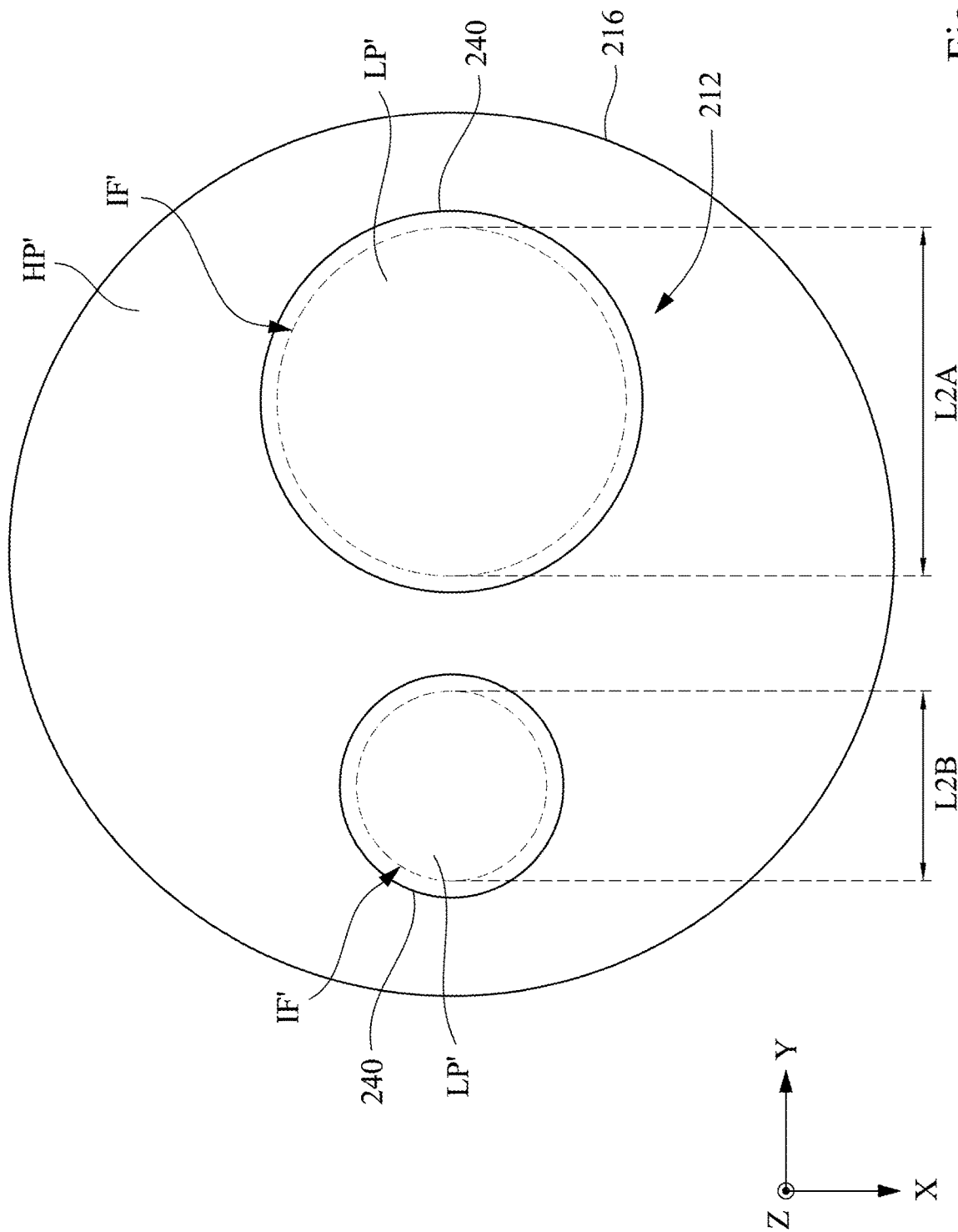
FIG. 4B is a schematic top view of a micro light-emitting diode according to some embodiments of the present disclosure.

Reference is made to FIGS. 4A and 4B. FIG. 4A is a schematic cross-sectional view of a micro light-emitting diode 200. FIG. 4B is a schematic top view of the micro light-emitting diode 200. In some embodiments, there are a plurality of low resistance portions LP' in the first type semiconductor layer 210. Although FIGS. 4A and 4B only illustrate two low resistance portions LP', embodiments can be extended to said plurality of low resistance portions LP'. Each of the low resistance portions LP' is isolated from each other by the diffuse type high resistance portion HP'. Each of the low resistance portions LP' is isolated from the side surface 216 of the first type semiconductor layer 210 by the diffuse type high resistance portion HP'. There are also a plurality of first electrodes 240 respectively in contact with the low resistance portions LP'. The multiple first electrodes 240 are electrically isolated from each other. Similar to the embodiments as shown in FIGS. 1A to 1C, the first type semiconductor layer 210 also has a first surface 212, a second surface 214, and the side surface 216 as mentioned. The plurality of low resistance portions LP' and the diffuse type high resistance portion HP' form a plurality of interfaces IF' each between a corresponding one of the low resistance portions LP' and the diffuse type high resistance portion HP' on the first surface 212, and concentrations of the guest material start decreasing from each of the interfaces IF' toward a corresponding one of the corresponding low resistance portions LP'. Taking FIGS. 4A and 4B as an example, a thickness L1' of the first type semiconductor layer 210, a lateral length L2A of one of the low resistance portions LP', and a lateral length L2B of the other low resistance portion LP' shall obey both a relation $L1'<(\frac{1}{2})*L2A$, and a relation $L1'<(\frac{1}{2})*L2B$ to guarantee the existence of undoped parts in both of the low resistance portions LP'. Structural relations between the first type semiconductor layer 210, a second type semiconductor layer 220, an active layer 230, and a second electrode 250 in the embodiments as illustrated by FIGS. 4A and 4B are identical or similar to the embodiments as illustrate by FIGS. 1A to 1C, and will not be described in detail herein. The plurality of low resistance portions LP' of the first type semiconductor layer 210 with the plurality of corresponding first electrodes 240, the (common) second type semiconductor layer 220, and the (common) second electrode 250 enable a digital control on the single micro light-emitting device 200. The micro light-emitting device 200 can thus act as multiple light emitting diodes. This configuration results in an easier control of the brightness of the micro light-emitting device 200.

In summary, a micro light-emitting diode having at least one low resistance portion and a diffuse type high resistance portion in a first type semiconductor layer is provided. Furthermore, a relation that a thickness of the first type semiconductor layer is less than half of a lateral length of the low resistance portion on a surface opposite to a second type semiconductor layer is proposed to guarantee an existence of at least a part of the first type semiconductor layer which is not influenced by a doped guest material via diffusion. As such, a current confinement in the low resistance portion is realized to improve the efficiency.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A micro light-emitting diode, comprising:
 a first type semiconductor layer having a first surface, a second surface opposite to the first surface, and a side surface connecting and extending between and in contact with the first surface and the second surface, the first type semiconductor layer comprising:

at least one low resistance portion extending between and reaching the first surface and the second surface;

a diffuse type high resistance portion extending between and reaching the first surface and the second surface, a guest material in the diffuse type high resistance portion having a constant concentration on the first surface, and a concentration of the guest material in the first type semiconductor layer decreasing from the diffuse type high resistance portion toward the at least one low resistance portion, wherein a thickness of the first type semiconductor layer is less than half of a lateral length of the at least one low resistance portion on the first surface, and the at least one low resistance portion and the diffuse type high resistance portion form an interface therebetween on the first surface, and a concentration of the guest material starts decreasing from the interface toward the at least one low resistance portion; and a second type semiconductor layer joined with the first type semiconductor layer through the second surface.

2. The micro light-emitting diode of claim 1, wherein the at least one low resistance portion is isolated from the side surface of the first type semiconductor layer by the diffuse type high resistance portion.

3. The micro light-emitting diode of claim 1, wherein the at least one low resistance portion is enclosed by the diffuse type high resistance portion.

4. The micro light-emitting diode of claim 1, further comprising:

an active layer between and joined with the first type semiconductor layer and the second type semiconductor layer, wherein the active layer is in contact with the second surface.

5. The micro light-emitting diode of claim 1, wherein the concentration of the guest material in the diffuse type high resistance portion decreases from the first surface to the second surface.

6. The micro light-emitting diode of claim 1, wherein the at least one low resistance portion has at least one local minimum concentration of the guest material therein.

7. The micro light-emitting diode of claim 6, wherein the at least one low resistance portion has a maximum concentration of the guest material on the interface.

8. The micro light-emitting diode of claim 1, further comprising a first electrode on the first surface of the first type semiconductor layer and in contact with the at least one low resistance portion.

9. The micro light-emitting diode of claim 8, wherein the first electrode covers the at least one low resistance portion.

10. The micro light-emitting diode of claim 1, further comprising a second electrode on and in contact with the second type semiconductor layer.

\* \* \* \* \*